United States Patent
Lee et al.

(10) Patent No.: US 6,988,536 B2
(45) Date of Patent: Jan. 24, 2006

(54) TUBULAR HEAT DISSIPATION DEVICE

(75) Inventors: Hsieh Kun Lee, Tu-Chen (TW); Cheng-Tien Lai, Tu-Chen (TW); Alan Zhou, Shenzhen (CN)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 10/831,434

(22) Filed: Apr. 23, 2004

(65) Prior Publication Data

US 2004/0226690 A1    Nov. 18, 2004

(51) Int. Cl.
*H05K 7/20* (2006.01)

(52) U.S. Cl. ................ 165/104.33; 165/121; 165/80.3; 361/697; 361/700

(58) Field of Classification Search ............. 165/80.3, 165/80.4, 104.33, 121, 185; 361/697, 700, 361/704

See application file for complete search history.

(56) References Cited

U.S. PATENT DOCUMENTS 5,529,115 A * 6/1996 Paterson ................ 165/104.33
6,315,033 B1 * 11/2001 Li ........................ 165/104.33
6,422,303 B1 * 7/2002 Ishida et al. ............... 165/80.3
6,439,298 B1 * 8/2002 Li ........................ 165/104.33
6,702,002 B2 * 3/2004 Wang ........................ 165/80.3
2002/0180285 A1 * 12/2002 Machiroutu ............... 310/67 R

FOREIGN PATENT DOCUMENTS

| CN | 2507138 Y | 8/2002 |
|---|---|---|
| CN | 2508394 Y | 8/2002 |
| TW | 459981 | 10/2001 |
| TW | 483727 | 4/2002 |
| TW | 504023 | 9/2002 |
| TW | 516815 | 1/2003 |

* cited by examiner

Primary Examiner—Allen J. Flanigan
(74) Attorney, Agent, or Firm—Wei Te Chung

(57) ABSTRACT

A heat dissipation device includes a base (10), a tube (20), a fin member, a fan (50) and a heat pipe (60). The tube, the fin member and the heat pipe are all in contact with the base, for absorbing heat away from the base. The fin member and the fan are juxtaposed with each other along an axial direction of the tube. The fan blows air toward the fin member and enhances airflow within the heat dissipation device. The tube prevents the air from the fan from being dispersed, so that complete uniform airflow through the heat dissipation is maintained.

15 Claims, 4 Drawing Sheets

TUBULAR HEAT DISSIPATION DEVICE

BACKGROUND OF THE INVENTION

1. Field of the Invention

The present invention relates to heat dissipation devices for removing heat from electronic components, and more particularly to a tubular heat dissipation device for dissipating heat from an electronic component.

2. Description of Prior Art

Conventional heat dissipation devices used for removing heat from electronic components are mostly formed by extrusion of metallic material. FIG. 3 shows an example of this kind of heat dissipation device. The heat dissipation device comprises a base, and a plurality of pins integrally extending from the base. The pins are relatively thick in comparison with distances defined between each two adjacent pins, due to inherent limitations in extrusion technology. This restricts the number of the pins that can be formed, and a total heat dissipation area that can be provided by the pins. Furthermore, a height of the pins is limited to about 13 times the distance between each two adjacent pins, also due to inherent limitations in extrusion technology.

With the continuing boom in electronics technology, numerous modern electronic packages such as central processing units (CPUs) of computers can operate at very high speeds and thus generate large amounts of heat. The heat must be efficiently removed from the CPU; otherwise, abnormal operation or damage may result. Conventional extruded heat dissipation devices are increasingly no longer able to adequately remove heat from these contemporary electronic packages.

In order to keep pace with these developments in electronics technology, assembled heat dissipation devices have been gaining in popularity. FIG. 4 shows an assembled heat dissipation device comprising a base 200 for contacting a top surface of the electronic package, a plurality of spaced, stacked fins 400 parallel to the base 200, and a plurality of heat pipes 300 engaged transversely through fins 400 and engaged with the base 200. This heat dissipation device provides a larger heat dissipation area. However, heat accumulated on the base 200 is transferred away to the fins 400 merely through the heat pipes 300, which provide relatively small contact areas with the base 200. In addition, the fins 400 are still relatively small. Furthermore, it is difficult to provide forced air convection, because of the arrangement of the heat pipes 300 and the fins 400. No matter where on the heat dissipation device a fan is mounted, the heat pipes 300 block airflow and create much turbulence. For all these reasons, the efficiency of heat removal is frequently not adequate for a modern electronic package.

SUMMARY OF THE INVENTION

Accordingly, an object of the present invention is to provide a heat dissipation device which can rapidly remove heat from an electronic device.

Another object of the present invention is to provide a heat dissipation device which has great internal heat transfer capability.

In order to achieve the objects set out above, a heat dissipation device in accordance with a preferred embodiment of the present invention comprises a base, a tube, a fin member, a fan and a heat pipe. The tube, the fin member and the heat pipe are all in contact with the base, for absorbing heat away from the base. The fin member and the fan are juxtaposed with each other along an axial direction of the tube. The fan blows air toward the fin member and enhances airflow within the heat dissipation device. The tube prevents the air from the fan from being dispersed, so that complete uniform airflow through the heat dissipation is maintained.

Other objects, advantages and novel features of the present invention will become more apparent from the following detailed description when taken in conjunction with the accompanying drawings, in which:

DETAILED DESCRIPTION OF THE INVENTION

Figure 1:
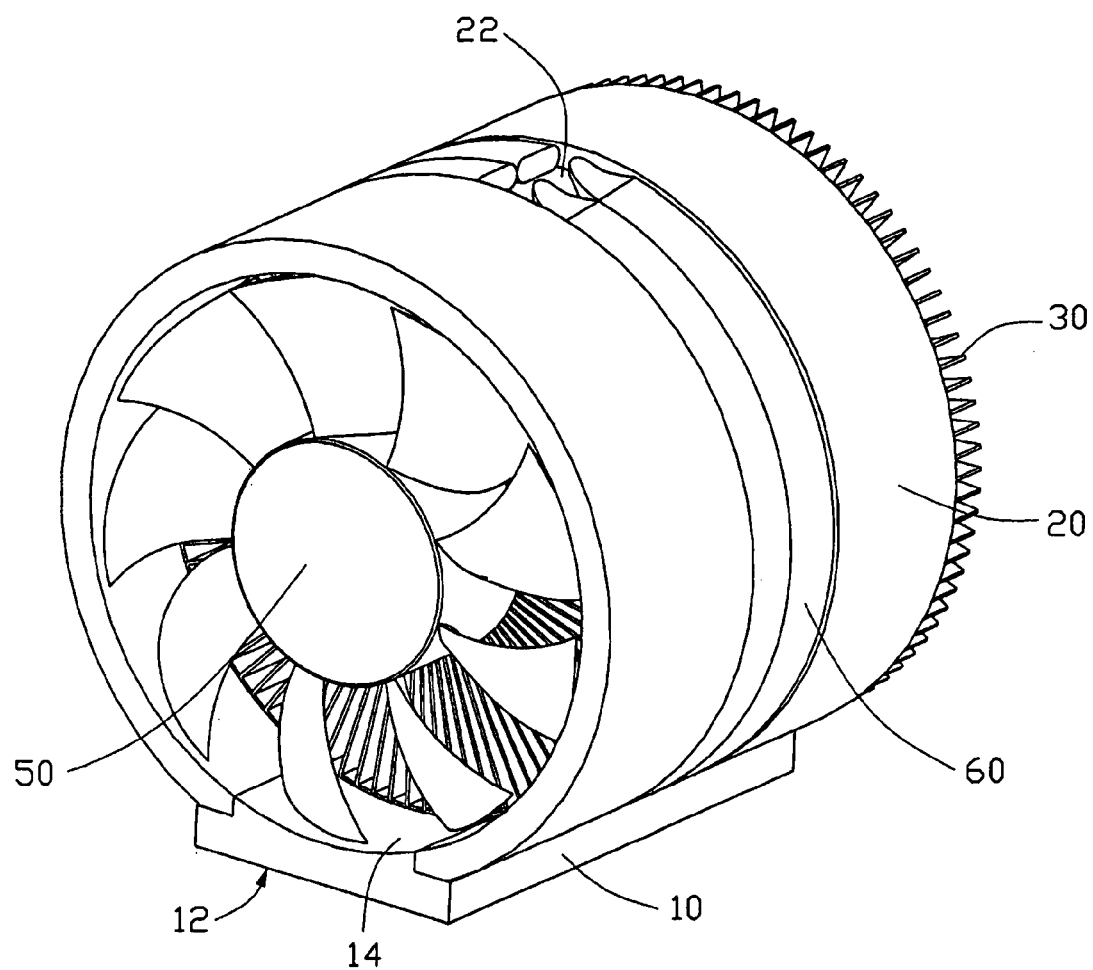
FIG. 1 is an isometric view of a heat dissipation device in accordance with the preferred embodiment of the present invention.
Figure 2:
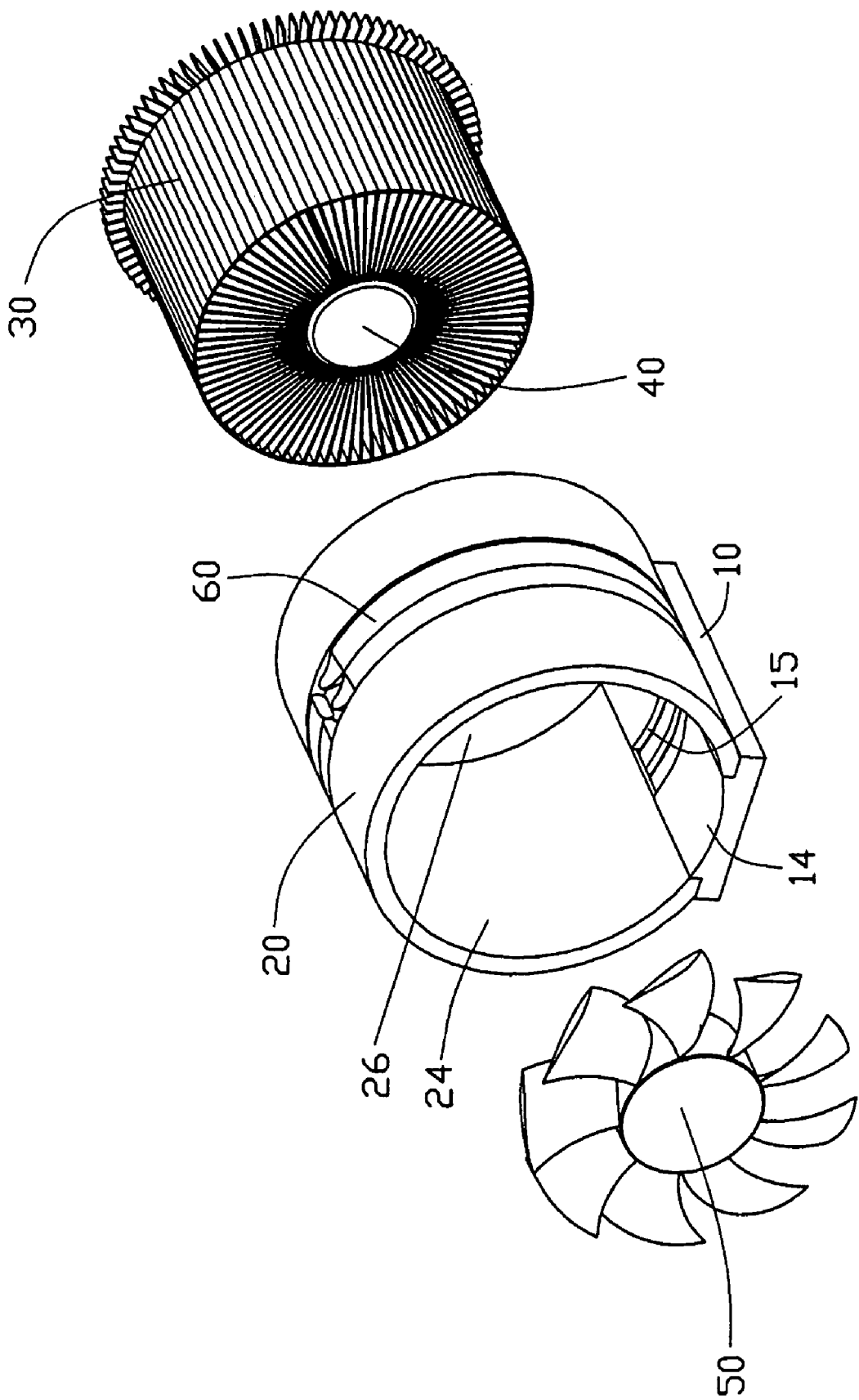
FIG. 2 is an exploded, isometric view of the heat dissipation device of FIG. 1.
Figure 3:
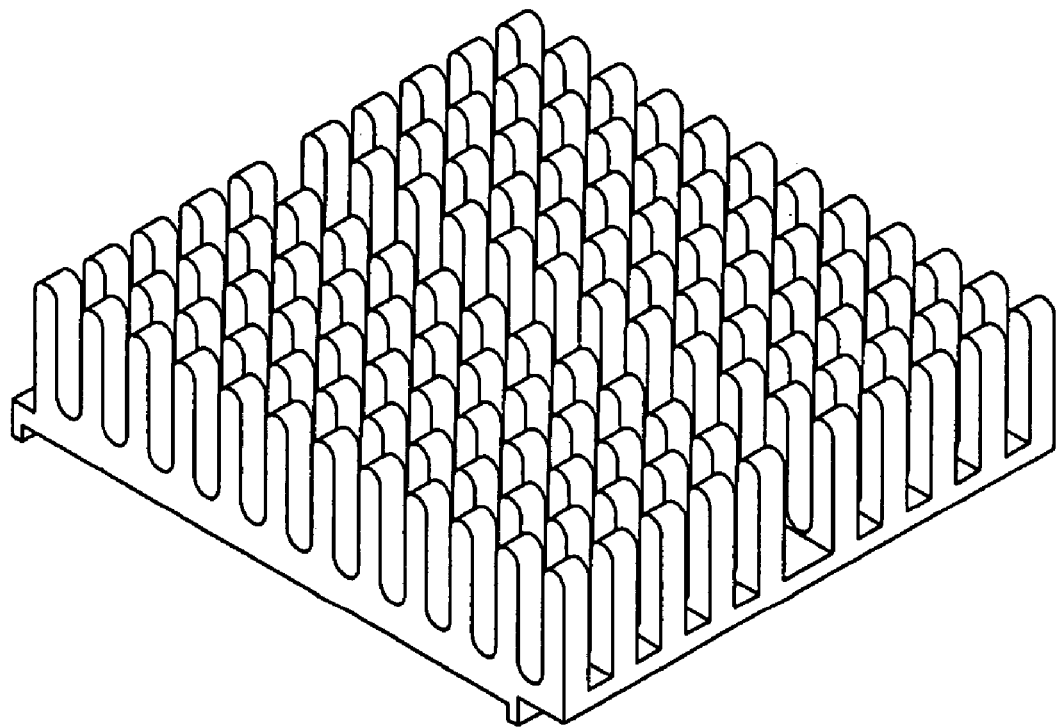
FIG. 3 is an isometric view of a conventional heat dissipation device.
Figure 4:
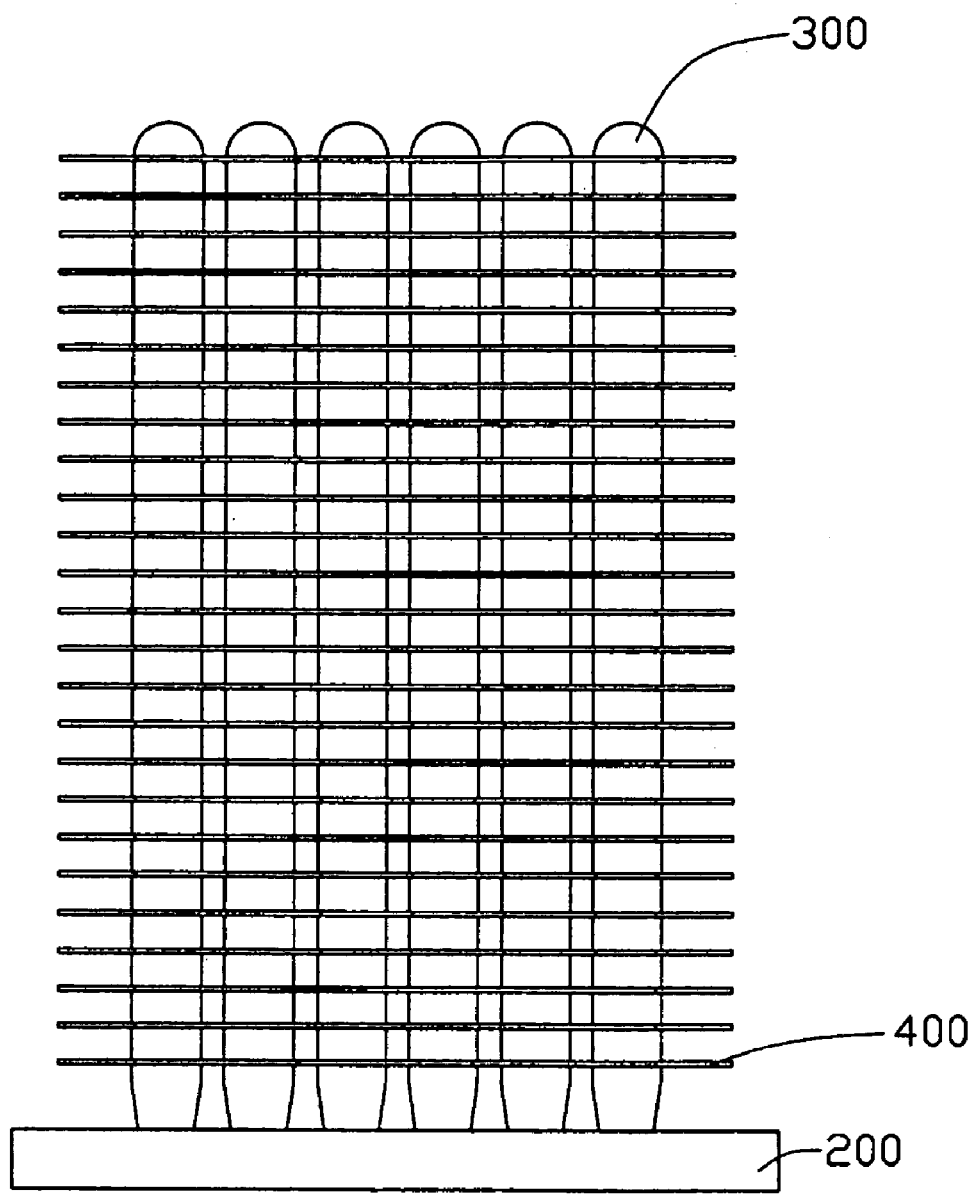
FIG. 4 is a side elevation of another conventional heat dissipation device.

Referring to FIGS. 1–2, a heat dissipation device in accordance with the preferred embodiment of the present invention comprises a base 10, a tube 20, a plurality of fins 30, a cylindrical core 40, a fan 50 and a pair of heat pipes 60.

The base 10 has a flat bottom surface 12 for contacting a top surface of an electronic package (not shown) such as an integrated circuit (IC), and a topmost surface 14 having an arcuate profile. The tube 20 has a C-shaped profile, and is fittingly supported on shoulders of the base 10 at opposite sides of the topmost surface 14 respectively. An inner surface of the tube 20 and the topmost surface 14 of the base 10 cooperatively provide a uniform cylindrical inner face. The combined base 10 and tube 20 define circular first and second openings 24, 26 at opposite ends thereof respectively. An arcuate first groove 15 is defined in a central portion of the topmost surface 14 of the base 10. A generally C-shaped second groove 22 is defined around an outer central portion of the tube 20. The second groove 22 and the first groove 15 cooperatively provide a uniform annular space. The heat pipes 60 each have a substantially annular configuration, and are fittingly received side by side in said uniform annular space. That is, the heat pipes 60 are in contact with each other, with the base 10 in the first groove 15, and with the tube 20 in the second groove 22. Each of the heat pipes surrounds the tube 20, and defines a plane on the corresponding cross-section of the tube 20 which is perpendicular to the axial direction of the tube, and further defines a non-loop configuration upon the corresponding cross-section. two opposite ends of each heat pipe 60 oppose each other in a part of the second groove 22 distal from the base 10. The fins 30 are spaced from each other and radially supported on the core 40. In the preferred embodiment, each fin 30 has a generally Z-shaped profile in an alternative embodiment, each fin 30 has a generally U-shaped profile. The combined fins 30 and core 40 is received in the tube 20 through the second opening 26. Peripheral portions of some of the fins 30 are in contact with the topmost surface 14 of the base 10. Peripheral portions of the other fins 30 are in contact with said inner surface of the tube 20. The fan 50 is mounted into the tube 20 through the first opening 24. The fan 50 provides forced air convection through the fins 30, thereby enhancing a rate of heat dissipation.

In the present invention, the tube 20, said some of the fins 30 and the heat pipes 60 simultaneously absorb heat away from the base 10. The tube 20 dissipates some heat away and transfers some heat to the peripheral portions of said other fins 30. The fan 50 enhances air flow between the fins 30. In addition, the tube 20 prevents air generated from the fan 50 from being dispersed. That is, complete uniform air flow through the heat dissipation device is maintained.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation device comprising:
   a base;
   a tube engaged on the base;
   a fin member abutting the base and received in the tube;
   a heat pipe engaged around the tube and engaged with the base; and
   a fan mounted to the tube adjacent the fin member along an axial direction of the tube, the fan blowing air toward the fin member.

2. The heat dissipation device of claim 1, wherein the base comprises a flat bottom surface, and a topmost surface having an arcuate profile.

3. The heat dissipation device of claim 2, wherein an arcuate first groove is defined in the base, and the heat pipe is engaged with the base in the first groove.

4. The heat dissipation device of claim 2, wherein the tube is fittingly supported on the base at opposite sides of the topmost surface.

5. The heat dissipation device of claim 2, wherein an inner surface of the tube and the topmost surface of the base cooperatively provide a uniform cylindrical inner face.

6. The heat dissipation device of claim 2, wherein the fin member comprises a core disposed along the axial direction of the tube, and a plurality of spaced fins radially supported between the core and the tube.

7. The heat dissipation device of claim 1, wherein the tube defines a second groove around an outer central portion thereof, the heat pipe being engaged around the tube in the second groove.

8. The heat dissipation device of claim 1, wherein the tube has a generally C-shaped profile.

9. The heat dissipation device of claim 7, wherein ends of the heat pipes oppose each other in a part of the second groove distal from the base.

10. A heat dissipation device comprising:
    a heat receiving member;
    a fin member located above the heat receiving member;
    a tube surrounding and in thermal contact the fin member;
    a plurality of discrete heat pipes connected to the heat receiving member and the tube; and
    a fan located on one end of the tube along an axial direction thereof for blowing air toward the fin member; wherein
    each of the heat pipes surrounds the tube, and defines a plane on a corresponding cross-section of the tube which is perpendicular to an axial direction of the tube, and further defines a non-loop configuration upon the corresponding cross-section under a condition that two opposite ends of each heat pipe oppose each other.

11. The heat dissipation device of claim 10, wherein the fin member comprises a core disposed along the axial direction of the tube, and a plurality of spaced fins radially extending from the core to the tube.

12. The heat dissipation device of claim 11, wherein the heat receiving member comprises an arcuate surface in which an arcuate first groove is defined, and one end of said heat pipe is engaged with the base in the first groove.

13. The heat dissipation device of claim 12, wherein the tube defines a second groove around an outer portion thereof, and an opposite end of said heat pipe is engaged around the tube in the second groove.

14. The heat dissipation device of claim 13, wherein the tube is engaged with the heat receiving member.

15. A heat dissipation device comprising:
    a heat receiving member;
    a fin member comprising a plurality of fins;
    a tube contacting said heat receiving member; and
    at least one heat pipe contacting the heat receiving member and said tube for transferring heat from the heat receiving member to the tube and further to the fins for dissipation;
    wherein an inner surface of the tube and a top surface of the heat receiving member cooperatively provide a uniform cylindrical inner face which is in contact with peripheral portions of the fins.

* * * * *